United States Patent [19]

Linnenbrink

[11] Patent Number: 4,586,010
[45] Date of Patent: Apr. 29, 1986

[54] CHARGE SPLITTING SAMPLER SYSTEMS

[75] Inventor: Thomas E. Linnenbrink, Wilmette, Ill.

[73] Assignee: Q-Dot, Inc., Colorado Springs, Colo.

[21] Appl. No.: 431,012

[22] Filed: Sep. 30, 1982

[51] Int. Cl.$^4$ .................. H03H 15/02; G11C 27/00
[52] U.S. Cl. .................................... 333/165; 333/20;
  333/166; 377/60
[58] Field of Search .............. 333/165, 166, 173, 20;
  377/60–63, 70–71; 357/24 R; 307/239, 241,
  246, 350, 353; 365/174, 183–188

[56] References Cited

U.S. PATENT DOCUMENTS

| | | | |
|---|---|---|---|
| 4,152,606 | 5/1979 | Hornak | 377/63 |
| 4,259,598 | 3/1981 | Tiemann et al. | 333/165 X |
| 4,313,178 | 1/1982 | Stern et al. | 365/183 |
| 4,393,357 | 7/1983 | Linnenbrink et al. | 333/165 |

Primary Examiner—Marvin L. Nussbaum
Attorney, Agent, or Firm—Fitch, Even, Tabin & Flannery

[57] ABSTRACT

Methods and apparatus for high speed signal sampling and recording utilizing mutual repulsion field-induced splitting of charge carriers in a charge transfer channel.

12 Claims, 3 Drawing Figures

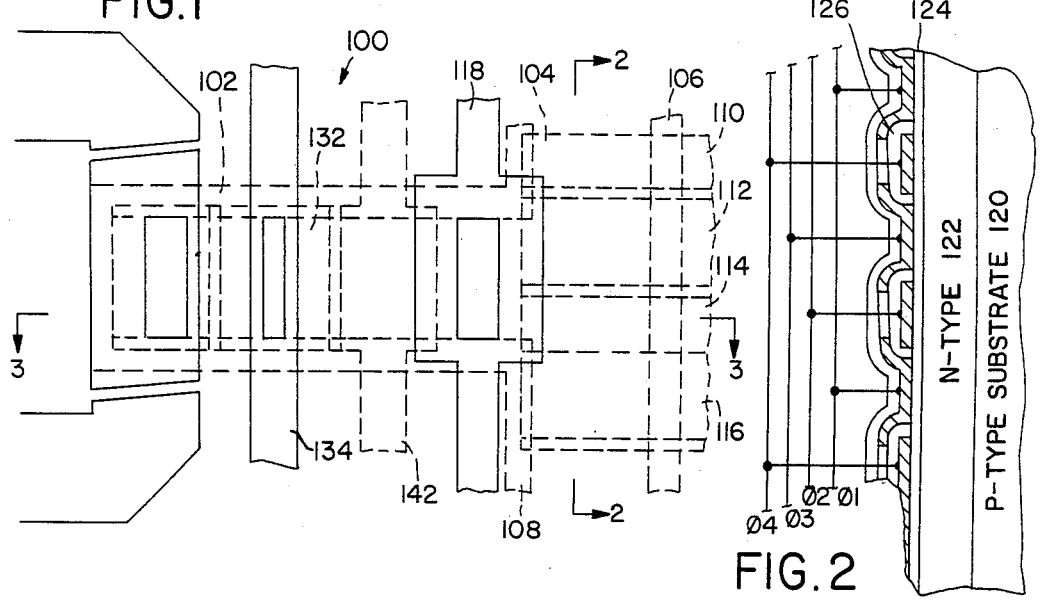
FIG.1
FIG.2
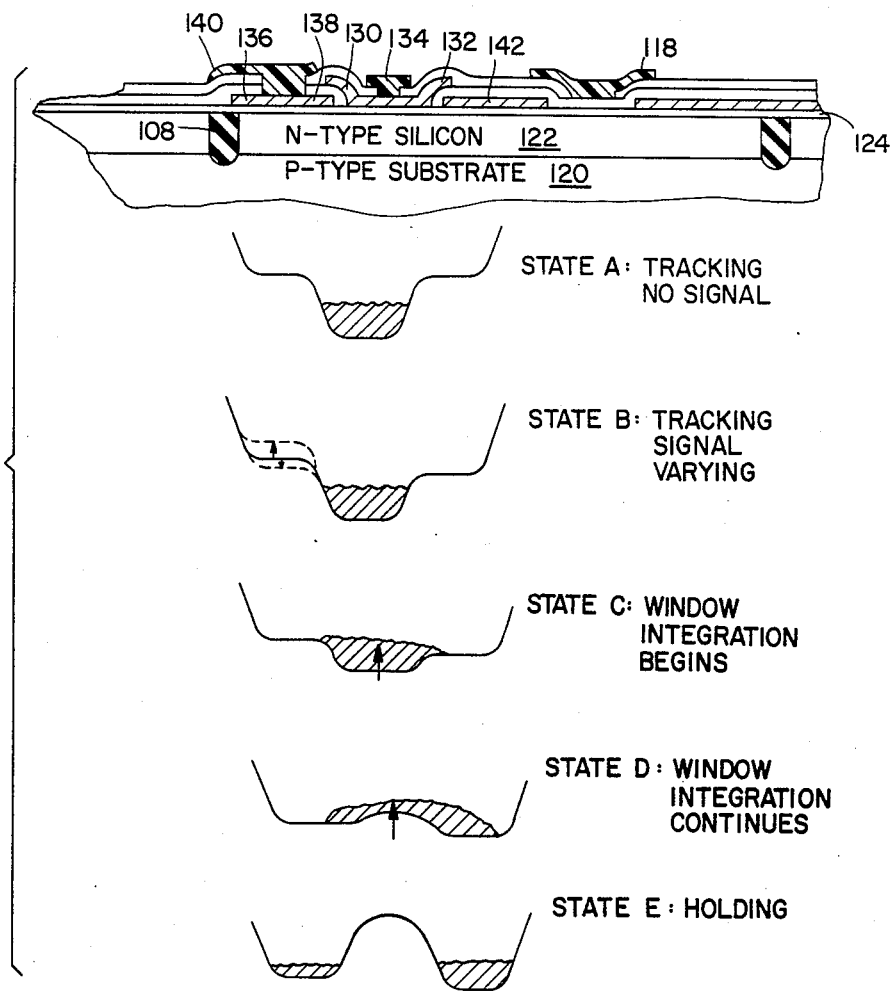
FIG.3
STATE A: TRACKING NO SIGNAL
STATE B: TRACKING SIGNAL VARYING
STATE C: WINDOW INTEGRATION BEGINS
STATE D: WINDOW INTEGRATION CONTINUES
STATE E: HOLDING

CHARGE SPLITTING SAMPLER SYSTEMS

The present invention is directed to methods and devices for high speed transient data recording, and more particularly, is directed to high speed signal sampling methods and integrated circuit devices.

The recording of wide bandwidth transient data has presented a significant challenge to instrumentation developers. Transient data (i.e., any high-bandwidth data, particularly including noncyclic or nonrepetitive data, in a low-bandwidth background) has traditionally been recorded by means of oscilloscope cameras or scan converters but such systems have significant cost and performance limitations.

Transient data recorders have also used high speed charge coupled devices (CCD's) to provide a dual-speed analog buffer. Full-rate, sampled analog data (i.e., discrete-in-time, continuous-in-amplitude data) are shifted into the CCD in a charge-equivalent-to-signal form at the full sampling rate, which may typically be five times the bandwidth. Data are continuously shifted in until a trigger stops the process. The trigger can occur before, during or after the event of interest. Once the event is captured, the data may be shifted out of the CCD at a slower rate [Y. T. Chan, et al., "Extremely High Speed CCD Analog Delay Line", Proceedings of 1975 International Conference on the Application of Charge-Coupled Devices, San Diego, Calif., Oct. 29–31, 1975, pp. 389–398; D. A. Gradl, et al., "High Speed Operation of CCDs", ibid., pp. 399–412; T. E. Linnenbrink et al., "A CCD-Based Transient Data Recorder", ibid., pp. 443–453; J. W. Balch, et al., "A CCD Integrated Circuit for Transient Data Recorders", Proceedings of Conference on Charge-Coupled Device Technology and Applications, Washington, D.C., Nov. 30–Dec. 2, 1976, pp. 115–119; and T. E. Linnenbrink, et al., "A One Gigasample per Second Transient Recorder", IEEE Transactions on Nuclear Science, Vol. NS-26, No. 4, August, 1979, pp. 4443–4449]. Various aspects of high speed CCD transient recorder systems are set forth in U.S. Pat. Nos. 4,314,212 and 4,340,874. Methods and integrated circuit systems which are particularly intended for very high speed signal sampling utilizing charge transfer under signal influence are described in copending application Ser. No. 231,292 filed Feb. 4, 1981 by applicant and another now U.S. Pat. No. 4,393,357, which is incorporated herein by reference.

However, further improvements in transient data recording, particularly in respect to methods and apparatus for extremely high frequency signal sampling, would be desirable.

Accordingly, it is an object of the present invention to provide methods and apparatus for transient signal recording which are particularly adapted for very high bandwidth operation. It is a further object to provide new integrated circuit devices, and methods for utilizing such devices, which are particularly adapted for extremely high speed signal sampling. These and other objects of the present invention will become more apparent from the following detailed description and the accompanying drawings, of which:

FIG. 1 is a plan view of an embodiment of a charge-splitting sampler device in accordance with the present invention, with underlying elements illustrated by dotted line;

FIG. 2 is a cross sectional side view, taken through line 2—2, of the charge-splitting sampler device of FIG. 1, positioned such that the various circuit elements there depicted are in registration with FIG. 1; and FIG. 3 is a cross sectional side view of the charge-splitting sampler cell of the device of FIG. 1, taken through line 3—3, together with schematic representations A, B, C, D and E of various operational states of the device.

Generally in accordance with the present invention, methods and apparatus are provided for splitting a packet of charge carriers into at least two packets as a function of an applied signal potential. By combining a plurality of charge splitting devices at sampling sites distributed with respect to the time response, or waveform, of a transient signal, transient recorder systems having very high speed sampling characteristics may be provided. In accordance with sampling method aspects, a charge packet storage well is established in a semiconductive charge transfer zone and a predetermined quantity of charge carriers is provided in the storage well. In addition, a plurality of charge collection potential wells is established in the semiconductive charge transfer zone adjacent the charge packet storage well, the potentials of said charge collection potential wells being insufficient to permit transfer of charge carriers from the storage well to the collection wells. The potential of at least one of the collection wells is directly responsive to the signal potential. In order to carry out the sampling process, the potential of the storage well is abruptly raised above the potential of the collection wells such that said charge carriers are distributed into the collection wells as a function of the potential difference among the collection wells at the time of raising the storage well potential. The quantity of charge in at least one of the collection wells may subsequently be measured to provide a function of the signal potential at the time of sampling.

In accordance with various additional aspects of the present invention, data may be acquired and recorded utilizing signal-dependent splitting of charge carriers contained in potential wells of a charge-coupled device. When the charge splitting is carried out under the influence of the electric field of a transient data signal propagated along a transmission line associated with a plurality of such charge splitting potential wells, the transient data signal may be recorded as a function of the charge splitting which occurs as a result of the applied signal field at the respective sampling sites.

In accordance with further device aspects of the invention, integrated circuit devices are provided for recording high frequency analog transient data signals, which comprise charge transfer channel means for providing a plurality of charge potential wells at a plurality of sampling sites disposed along a charge transfer channel, and for transferring charge carrier packets along the channel. Various electrode configurations may be utilized to provide charge wells and charge transfer. In order to provide rapid charge carrier response, buried channel charge transfer architecture is particularly desirable, and is particularly preferred as will be appreciated from the following description. Similarly, the highest mobility carrier will most preferably be utilized. In the case of devices fabricated of monocrystalline silicon, electrons are particularly preferred as charge carriers for the devices, which accordingly will preferably be fabricated using buried n-channel technology. In this case, reference to increasing depth of a potential well refers to increasing positive potential. However, it will be appreciated that increasing "depth" of a potential well refers to an increasing tendency of the particular charge carriers used for measurement purposes to be transferred to the potential (which will vary depending on the type of charge carrier and whether the system uses majority or minority carriers).

The devices further include at least one transmission line disposed (at least in part) along said transfer channel means at the respective sampling sites, for receiving and propagating a transient data signal to be recorded to each of said plurality of sampling sites, and for providing an electric field at each of the sampling sites representing the potential of the transient data signal at each respective sampling site. The transient data signal to be recorded is propagated sequentially to the sampling sites, and is accordingly distributed in time along the transmission line means, and hence the sampling sites, as the signal is transmitted.

Transient recorder devices further include means for splitting charge carriers at the respective charge splitting sampling cell potential wells to a plurality of at least two adjacent potential wells as a function of the transient data signal field provided by said transmission line means at each of said respective sampling sites, and for measuring the charge fraction split into at least one of the adjacent potential wells at each sampling site as a function of the transmission line field at such sites. By initiating the splitting of charge carriers at a predetermined time, the time-potential representation of the transient data signal may be recorded by means of the charge splitting from the respective sampler potential wells at such time.

In accordance with additional method aspects of the present invention, high frequency transient data signals may be recorded by providing a plurality of sampler charge wells at a plurality of sampling sites in charge transfer communication with a charge transfer channel, and by providing a plurality of at least two potential wells immediately adjacent each respective sampler charge well. Further in accordance with such methods, a predetermined quantity of charge is provided in each of the sampler charge wells while the potential wells adjacent thereto are maintained substantially free of charge carriers. A transient data signal to be recorded is propagated along a transmission line sequentially to each of the charge splitting sampling sites to provide a representation of the transient data signal in time along the transmission line and to vary the potential of at least one of the potential wells adjacent to the respective charge splitting sampler well at each of the sampling sites. Upon raising the potential of the charge splitting sampler potential well to a potential higher than the potential of the charge collection wells immediately adjacent thereto, the sampler charge is rapidly distributed into the charge collection potential wells at the respective sampling sites in a manner which depends on the difference in potential between the respective charge collection potential wells.

In this manner, the transient data signal may be recorded as a function of quantity of charge of a series of charge carrier packets which may be transferred out of the charge transfer channel and measured in an appropriate manner. It is a particular advantage of transient data recorder methods and devices in accordance with the present invention that very high speed sampling intervals may be provided for in device design, but that input and output charge transfer functions, as well as transfer of charge packets along the transfer channel, need not necessarily be carried out at high speeds. Further in accordance with the invention, uniform charge packets having a fixed, uniform quantity of charge may be transferred to each of the respective charge splitting sampler sites prior to initiation of the signal recording function to provide direct signal recording. However, the quantity of charge may also be varied at each sampling site to provide for on-chip signal processing functions such as correlation and/or error correction.

Having generally described various aspects of the present invention, the invention will now be described in more detail with respect to the specific embodiments illustrated in FIGS. 1-3 of the drawings.

Illustrated in plan view in FIG. 1, with underlying elements illustrated by dotted line, is a charge splitting sampler device 100 comprising a charge splitting sampler cell 102 and a charge transport channel means 104 for introducing and removing charge from the charge splitting sampler cell 102. The charge splitting sampler cell 102 is a particularly important aspect of the present invention, and is illustrated in more detail in FIG. 3, which is a cross sectional view of the device 100 of FIG. 1, taken through line 3—3.

It is a feature of the present invention that the charge transport channel means 104 may be of relatively conventional design, which may utilize relatively slow clocking and transport drivers (e.g., 100 KHz) in its operation. The charge transport means 104, is shown in more detail by FIG. 2, which is a cross sectional view of the device 100 taken through line 2—2 of FIG. 1. The charge transfer channel means is defined by p-type channel stops 106, 108, and a plurality of gate components including four phase transfer gates 110, 112, 114, 116, together with cell charge input/output control gate 118. The CCD charge transport means is fabricated on a suitable p-type monocrystalline silicon substrate 120 and a suitable, n-type monocrystalline layer 122, in accordance with conventional fabrication technology to provide a buried n-channel charge transport construction in which the charge carriers are electrons in the depleted n-type layer 122. The four phase charge transport electrodes 110, 112, 114, 116 of the transfer means 104 may be fabricated of polysilicon layers separated by appropriate silicon dioxide and/or silicon nitride dielectric layers 124, 126 also in accordance with conventional CCD integrated circuit fabrication techniques. Charge input and output structures and transport clocking systems of conventional design may be provided for the channel.

As indicated, the charge splitting sampler cell is an important feature of the present invention, and is similarly fabricated on p-type substrate 120 and n-type layer 122. The n-type layer 122 is formed as an extension of the CCD transport channel 104 by the p-type channel stop 108, with electrical communication therebetween being under the control of input/output electrode 118, as will be more fully described. The charge splitting sampling function of the cell 102 is carried out by cutter gate electrode 130, which in the illustrated embodiment comprises a polysilicon gate electrode 132 overlying the n-type charge transport region and separated therefrom by dielectric 124, the gate 132 being in direct electrical control with a more highly conductive overlying aluminum electrode 134 which in turn is electrically connected with generator means for providing a potential well bias and for providing a low rise time pulse (e.g., a rise time of 100 picoseconds or less) when it is desired to sample a signal. The cutter gate is adapted to provide a relatively deep potential well in the n-type silicon channel 122 thereunder when provided with the generator means bias. The charge splitting sampler cell 102 further includes a signal gate electrode 136 immediately adjacent one side of the cutter gate 130. The signal gate comprises a polysilicon gate 138 in electrical connection with an overlying, highly conductive aluminum signal transmission line 140 to which is applied the signal which is desired to be measured by the cell 102. Application of an appropriate potential or bias to the signal gate 136 produces a potential well in the n-type channel 122 adjacent the potential well produced therein by the cutter gate 130. The cell 100 further comprises a polysilicon reference electrode 142 immediately adjacent the other side of the cutter gate electrode 130 to which may be applied a reference bias to generate a potential well adjacent the cutter gate potential well produced by the cutter gate 120. The electrodes 136, 142 may be in electrical connection with means for providing a bias sufficient to produce respective potential wells adjacent the cutter gate well which is shallower than the cutter gate well. In operation, the device 100 functions to split charge carriers from the potential well formed under the cutter gate 130 to potential wells under the signal and reference gates as a function of the difference in potential therebetween. Accordingly, by imposing the signal to be measured on an appropriate center bias potential, at the signal gate 136, while maintaining a constant bias potential on electrode 142, the potential of a transient signal applied to the gate 136 may be manifested as a difference in depth of potential well between the respective signal and reference gates 136, 142.

As indicated, the charge splitting sampler cell 100 comprises three adjacent gates 130, 136, 142 which function to produce potential wells in the buried charge transport channel 122 bounded by an appropriate channel stop 108. In operation, all three gates are initially biased to form potential wells. The potential well under the cutter gate 130 is significantly deeper (e.g., 10-12 volts) than either the signal or reference wells, which will preferably be in the range of from 5 volts to 7 volts. Thus, when a packet of charge is transferred into the sampler cell 100, substantially all of it flows under the cutter gate and resides in the deep well there, as shown in State A of FIG. 3.

As a transient signal applied to the signal gate directly varies the potential under the signal gate, the well bottom thereunder follows. By design, the signal well never reaches a potential sufficiently low to permit charge flow from under the cutter gate, as shown by State B of FIG. 3. When a sample is desired, the potential of the cutter gate 130 is abruptly raised, increasing the potential of the charge under it. As the potential under the cutter gate exceeds potential under either the signal gate or reference gate, electrons will begin to shift into these regions. In State B of FIG. 3, just prior to sampling, the potential of the well under the signal gate 136 is shown lower than the potential of the reference gate 142. As the potential of the cutter gate 130 is raised, as shown in State C of FIG. 3, charge starts to flow under the signal gate first. As the cutter potential well continues to rise, as shown in State D of FIG. 3, charge starts to flow into the potential well under the reference gate 142, while continuing to flow into the potential well under the signal gate 136. Upon completion of the sampling cycle as shown in State E, the original charge packet initially contained under the cutter gate 130 is split into two co-packets into the adjacent potential wells under the reference and signal gates, respectively. The amount of charge in each co-packet is related to the signal potential relative to the reference potential as the potential of the buried channel semiconductor zone under the cutter gate was raised. The charge packets under the signal and reference gate, may be transferred out of the sampler 102 to the transport channel 104 by using electrodes 130, 142 and 118 as transfer electrodes under control of suitable transport clocking signal systems in accordance with conventional practice. The charge packets may then be transferred along the transfer channel 104 under control of electrodes 110-116 for appropriate detection and measurement. It will be noted that it may be desirable to first clock out all reference well packets and then all signal well packets, or they may be clocked out in alternate relationship. In any event, it is noted that increased measurement accuracy is provided by measuring both packets produced by each sampling sequence. After completion of a measurement sequence and appropriate depletion of the n-type channel 122, the device 100 may be recharged for sampling by introducing charge carrier packets of predetermined size into the channel 104, and clocking the packets into the well under the electrode 130 in an appropriate manner.

The tracking of the sampler device 100 is extremely rapid because the tracking lag is primarily due to the lag in the potential function under the signal gate 136 in responding to the signal applied. Because the signal well is substantially empty during this period, it responds substantially with the relaxation time of the n-type monocrystalline charge transport channel material, which provides extremely fast response time. The tracking time constant for the device cell 100 is a function of the dielectric relaxation time of depleted n-type monocrystalline silicon channel underlying the respective electrode, which is nominally on the order of about a picosecond.

As the potential under the cutter gate 130 rises, at least one wall of the potential well confining charge under the cutter gate is suddenly eliminated. The dense electron packet initially responds by attempting to expand through the open potential wall under the influence of mutual repulsion, or self-induced field drive, which produces a very fast electron shift of a significant portion of the total charge. Once the potential of the cutter gate 130 reaches its full value (its full height in FIG. 3, State E) and the charge packet is split, the amount of time for the last electrons to drain from the zone under the cutter gate 130 into the wells defined by either the signal or reference gates 136, 142 is not a significant detriment of the sampling speed, because their ultimate destinations have substantially already been determined.

In modelling the charge splitting mutual repulsion sampler of the type illustrated in FIGS. 1-3, the illustrated sampling structure parameters may be designed to maximize charge transport initiated by carrier drift under the influence of self-induced electric fields. The p-type substrate 120 may have a typical substrate electron acceptor impurity concentration of, for example, $5 \times 3$, $10^{14}/cm^3$ covered by an n-type region having a thickness of in the range of 2-5 microns (e.g., about 3 microns) and a conventional buried channel donor impurity concentration (e.g., $1.5 \times 10^{15}/cm^3$). The signal electrodes may be wider than the cutter gate electrode, and all of the electrodes may be longer than they are wide to increase the number of charge carriers without increasing the carrier travel distance during charge splitting.

The signal potentials on the electrodes adjacent the cutter gate 130 influence the manner in which charge divides between the channel regions under these electrodes, upon abrupt elimination of the potential well under the cutter gate. Initially, cutter gate electrode 130 may be biased at a potential in the range of from about 10 volts to about 15 volts, e.g., 12 volts, and electrodes 136 and 142 may be biased at a potential less than the cutter gate potential well bias, such as in the range of 5 to 7 volts. Prior to sampling, electrons are present in equilibrium in the potential well cutter gate electrode 130 with an approximate maximum concentration of $9 \times 10^{10}/cm^2$. The charge sampling process is begun by abruptly changing the bias of cutter gate electrode 130 from, say 12 to, say $-5$ volts with a short rise time. Under the influence of the cutter sampling signal, electrons begin to transfer to the channel regions under electrodes 136 and 142. During the rise time of the cutter gate signal, electrons are transferred first to the channel region under the most positive signal electrode and later to the channel region under the less positive signal electrode. After the cutter signal has reached its final value, the charge continues to transfer until equilibrium is achieved.

The initial charge transport occurs as a result of self-induced drift as the electric field originally containing the charge packet under the cutter electrode is reduced and eventually reversed in sign. The speed of this charge movement is primarily affected by the initial concentration of the charge packet. During the change in the cutter electrode bias, electric fields are established along the channel which cause electrons to drift away from the channel region under the cutter electrode. This is the primary basis for charge transport after the cutter signal has reached its final value.

Charge is preferentially transported toward the channel region under the electrode having the deeper potential well at the time the cutter potential is reduced. The charge eventually reaches equilibrium with a larger number of electrons under the more positive adjacent electrode. The charge fraction under the respective signal and reference gates is accordingly primarily a function of the difference in potential between the reference and signal gate at the time of raising the cutter gate. Charge separation based on the self-induced drift mechanism utilized in the present invention is not in theory particularly sensitive to cutter gate rise time.

In this regard, system modelling indicates that increasing the cutter signal rise time from 50 picoseconds to 100 picoseconds has a relatively limited effect on the charge separation because the initial division of charge between the channel regions is governed by the electric fields along the channel. These fields depend on the electrode biases, but are relatively independent of the cutter signal rise time. Lateral response of charge from under the cutter gate does not appear to be significantly constrained by cutter rise times as short as 50 picoseconds, and faster rise times may provide even shorter integrating windows for transient recorders utilizing devices of the type shown in FIG. 1.

The response time of the channel potential outside the cutter region is extremely fast before the sampling process occurs, and the division of charge between channel regions under the signal electrodes and reference is primarily governed by the signal potentials present during the rise time of the cutter potential. However, the charge division is somewhat affected by signal potential variations during the time from the end of the cutter potential rise time to the time when the charge concentration under the cutter electrode becomes negligible.

In this regard, device modelling for a transient signal that exhibits a nominal one volt full variation indicates that about 30% of the electrons initially present under the cutter gate may be shifted in response to potential on the signal and reference gates and about 80% of the shiftable electrons' eventual destination has already been determined when the cutter reached full height, although the electrons may not yet physically reside under an adjacent electrode at that time. Modelling further indicates however, that the remaining fifth (of the 30% of electrons subject to splitting under signal potential) are steered by signal potential after the cutter potential has risen for the remainder of an approximately 200 picosecond period commencing with initial cutter movement. This delayed response is due to the fact that some charge remains in the potential well under the cutter gate even after it has risen.

Such delayed response may be corrected by an appropriate correction algorithm. Dynamic range is a function of how much charge resides under the cutter gate initially and how much of that charge is influenced by signal. A charge splitting sampler device such as device 100 having a cutter gate well 5 micrometers wide and 100 micrometers long may confine, for example, approximately 450,000 electrons under the cutter gate 130. If 30% of these electrons may be influenced by the signal field, a dynamic range of over 50 decibels (with a noise floor of 200 electrons) may be provided.

A plurality of charge splitting sample cells may be integrated to form an integrated circuit transient recorder. The signal electrode 136 may be formed as a serpentine microstrip delay line to provide a delay length over the sampler sites 100 distributed along the device approximately equal to the total desired record length. To achieve low loss over long delay lengths the transmission strip width should be relatively large and should maximize use of higher conductive materials. These factors should be accommodated in the system design.

As an example, a microstrip serpentine delay line structure 136 which interfaces a sampling array at every second 180° bend may space sample cells approximately eight times the microstrip dielectric thickness apart, to minimize transmission line self-crosstalk. For a one nanosecond delay, a 25 micron strip width may be provided to minimize cross-talk. To provide a half nanosecond delay, a 12 micron wide strip using a sampler spacing of 125 microns may be utilized. Sample cells may be placed on both sides of the serpentine transmision line to effectively thereby double the number of sampler cells for a given structure length.

A typical device will be provided with several hundred or more stages, depending on the application and the number of signal samples desired.

The transport channel means 104 may be provided with conventional buried channel charge input/output structure (not shown). In operation, the transport channel 104 and the buried transport channel under the signal gate and reference electrodes may be substantially completely depleted of majority charge carriers by application of a positive potential to an output diode in the channel means, and appropriate clocking of the transport electrodes 110-116 and I/O control gate electrode 118. Before sampling, an appropriate charge input means may meter generally uniform charge packets into the transport channel 104, which may be then clocked into the device at a conveniently low rate (e.g., 100 kilohertz) under the control of transport electrodes 110-116, which are operated under control of conventional four phase electrode drivers. When the device transport channel 104 has been fully loaded, each sampling cell, in the transport clocking on gates 110, 112, 114, 116 is stopped. At this time, a positive transport potential is applied to the I/O control gate 118, which is normally in a "raised" position, so that the charge packets are transferred under the respective gates 118 of the sampler cells 118. The charge packets are subsequently transported to the respective cutter gate wells of the charge splitting sampler sites in a conventional manner by applying an appropriate transport sequence to the reference, cutter and I/O electrodes 118, 130, 142. A transient signal to be recorded may then be applied to transmission line 136. At the time it is desired to sample the transient signal, a sharp edge step is applied to cutter gate electrode 134, which in turn propagates the step through the bias to the polysilicon cutter gates 132 of the respective sampler cells 102. A suitable generator which produces a clean, sharp edge, (e.g., 20–200 picosecond rise time) for passage across the device 100, such as a step recovery diode generator, or avalanche transistor driver may be utilized to apply a suitable cutter pulse to the electrode 134. Upon onset of the trigger pulse to the cutter gate, the cutter gate step signal propagates along the array of charge splitter sampler cells 102, to separate the potential well into two adjacent potential wells as shown in FIG. 3. Because the sampling is initiated by a single pulse which travels sequentially along the charge splitting sampling cells, the sample to sample timing is well defined by propagation times inherent in the structure and is very repeatable.

The output structure for the CCD transport channel may be provided in accordance with conventional practice. For example, a conventional output transfer gate electrode to which the output charge is transferred before it is dumped into the n-type floating output diffusion may be provided such that when the charge is transferred to the output diffusion, the voltage change on that diffusion is sensed and brought to an on-chip output FET amplifier (not shown) to provide a voltage output proportional to the charge dumped onto that output diffusion. The output structure may also include a conventional reset gate element. After charge has been dumped onto the output diffusion, a more positive voltage may be applied to the reset gate to then cause conduction of the charge of the floating output diffusion into an n-type reset sink diffusion.

The input structure for the illustrated embodiment 100 may be of a conventional input structure design such as a fill and spill buried channel CCD input structure, although other input structures may also be used. For example, an n-type input diffusion may be provided having a suitable off-chip input potential source 512. An isolation gate and adjacent spill control gate to regulate the amount of charge may be provided as an input structure as described in copending application Ser. No. 231,292 now U.S. Pat. No. 4,393,357.

A transient recorder system which includes an integrated circuit device may be provided in which the transmission line 140 is a single ended transmission line. The signal source to be recorded is applied to one end of the transmission line 140. The other end of transmission line 140 may desirably be routed off the device chip, and be terminated in its respective characteristic impedance Zo. Another on-chip transmission line 134, designated herein as the cutter gate, is connected to an external step generator element. The other end of the control transmission line 140 is similarly brought off-chip and terminated in its characteristic impedance, Zo.

An output amplifier for the slow CCD register output, which may desirably be a single on-chip FET amplifier as previously described, is provided to convert charge packet information to a suitable output signal in accordance with conventional practice. The output of the output amplifier is provided as an input signal to an analog-to-digital converter, which may similarly be of conventional design. Despite the high speed signal sampling design of such a transient recorder system, the output operation of the CCD register and the output data rate of the system may be at a very low rate (e.g., 100 kHz) under control of a suitable clock generator which simplifies design constraints of the device.

An integrated circuit embodiment of such a transient recorder system may utilize a four phase transport overlapping electrode clocking architecture of conventional design.

At predetermined locations along the signal transmission line 140, the line 140 in a transient recorder embodiment may be brought to sampler sites, which are associated with transmission channel cells at regular intervals along the CCD transfer register. Similarly, the cutter gate transmission line 134 also intercepts the sampler sites at these predetermined locations along the line 134.

When the signal to be sampled is applied to one end of transmission line 140, the signal then propagates down the line 140 so that a time function of the signal is applied across the length of the transmission line 140 as a voltage distribution across the line, because of the finite length of time that it takes the signal to travel from signal input source to the termination of the transmission line. After the beginning of the signal function segment to be recorded has propagated across the full length of the line 140, then the signal function duration to be measured is generally distributed across the length of the transmission line 140 disposed adjacent sampling sites along the CCD transmission channel. At this point in time, a sampling control pulse is applied to cutter gate 134 by the external step generator. As this preferably squarewave control pulse propagates to each of the sampling sites, which it does at a rate faster than the site-to-site propagation rate along the line 140 because its length is much shorter than that of line 140, charge is distributed at each charge splitting sampler site 102 as a function of the transient signal potential at each sampling point along line 140 of the signal to be measured. In one type of embodiment, the cutter gate signal applied to line 134 is propagated in a direction opposite to the propagation direction of the signal to be sampled. The sampling speed may also be varied for a given device by applying the sampling signal in the same direction as the signal which is propagating along transmission line 136. As soon as the pulse then generated by the external step generator device has propagated across the line 134 and reaches the end termination point, the sampling process has been completed. All the samples of the signal are contained in the form of charge packets which have been split into two separate charge packets retained at each respective sampling site 102. The number of samples directly corresponds to the number of sampling cell units provided in the device.

The charge packet sample data then may be transferred at a relatively slow rate, serially out of the CCD register into a charge to voltage converter, as previously described through an amplifier. The output may be transmitted to an analog to digital converter, and placed into digital memory.

While one operational mode and structure has been described in regard to the devices of FIGS. 1–3, various alternative modes and structures may be provided utilizing the principles of operation described herein. For example, a plurality of more than two wells adjacent the cutter gate well may be provided (e.g., by a radial array of a plurality of electrodes around a centrally positioned cutter gate electrode) to provide charge splitting into a correspondingly increased plurality of wells each provided with an independent reference or signal potential. Similarly, while the transient signal is split between a signal gate and a reference gate, methods and devices may be provided in which the signal is propagated to dual gates which form the adjacent charge splitting potential wells.

While the embodiment 100 utilizes microstrip transmission lines adapted for ambient temperature operation, other transmission line designs may also be utilized. In this regard, coplanar transmission lines, superconducting transmission lines and balanced transmission line structures may be used in various embodiments. In general, however, it will be appreciated that particular attention should be provided to transmission line design, both on and off-chip, in order to avoid or minimize signal losses, dispersion or impedance discontinuities. Superconducting transmission lines may be regarded as substantially lossless as transient signal carriers, even at high frequency. However, while the operation of CCD structures at very low temperatures (and as temperatures appropriate to superconducting transmission lines) increases carrier mobility, such operation is disadvantageous from a practical standpoint. Coplanar transmission lines may be provided with excellent transmission characteristics, and may be particularly desirable as on-chip leads or serpentine segments between sampling sites.

Accordingly, it will be appreciated that in accordance with the present invention, methods and devices are provided which are adapted for extremely rapid signal sampling and processing. While particular aspects of the invention have been described with respect to certain specific embodiments, it will be appreciated that numerous modifications, adaptations and variations will become apparent from the present disclosure, and are intended to be within the spirt and scope of the present invention as defined by the following claims.

Various of the features of the invention are set forth in the following claims.

What is claimed is:

1. A method for splitting a packet of charge carriers into a plurality of at least two packets as a function of an applied signal potential, comprising the steps of
    establishing a charge packet storage well in a semiconductive charge transfer zone and providing a predetermined quantity of charge carriers in said well,
    establishing a plurality of substantially empty charge collection potential wells in said semiconductive charge transfer zone adjacent said charge packet storage well, the potentials of said charge collection potential wells being insufficient to permit transfer of said charge carriers from said storage well to said collection wells, the potential of at least one of said collection wells being varied in response to said signal potential,
    abruptly raising the potential of said storage well above the potential of said collections wells such that substantially all of said charge carriers are distributed from said storage well into said collection wells as a function of the potential differences among the collection wells at the time of raising the storage well potential, and
    measuring the quantity of charge in at least one of said collection wells.

2. A device in accordance with claim 1 comprising means for inputing charge packets of substantially uniform size to said charge transfer channel.

3. A device in accordance with claim 1 comprising means for inputing charge packets of predetermined non-uniform size to said charge transfer channel.

4. A method in accordance with claim 1 wherein the charge packet storage well is established by biasing said charge transfer zone at a cutter gate bias potential in the range of from about 10 to about 15 volts, and wherein said substantially empty charge collection potential wells are provided by biasing said charge transfer zone at a potential less than the cutter gate bias potential.

5. An integrated circuit charge splitting sampler cell comprising
    means for defining a semiconductive charge transfer channel, cutter gate means for providing a deep potential cutter gate charge carrier well in said charge transfer channel,
    means for providing a predetermined amount of charge in said cutter gate well,
    charge collector electrode means for providing a plurality of substantially empty charge collection potential wells adjacent said cutter gate potential well, the potential of at least one of said charge collection wells being determined at least in part by the electrical potential of a time-varying signal so that the relative well potentials of said charge potential wells vary as a function of the time-varying signal, and means for abruptly raising the potential of said cutter gate potential well to split the charge carriers therein into said charge collection wells adjacent thereto.

6. An integrated circuit device in accordance with claim 5 wherein said cutter gate means is biased at a cutter gate bias potential in the range of from about 10 to about 15 volts, and wherein said charge collection electrode means biases said charge transfer channel at a potential less than said cutter gate bias potential.

7. An integrated circuit device for recording transient data signals comprising,
    charge transfer channel means for providing a plurality of charge splitting sampling sites each comprising a charge potential well containing a predetermined quantity of charge carriers and at least two substantially empty charge collection wells respectively adjacent said charge potential well and disposed along a charge transfer channel, and for transferring charge carrier packets along said channel,
    electrical transmission line means disposed at least in part along said transfer channel means at said sampling sites, for receiving an electrical transient data signal to be recorded and for propagating said electrical transient data signal successively to each of said plurality of sampling sites such that said electrical transient data signal propagated thereon is distrubuted along said transmission line and applied to vary the potential of at least one of the charge collection wells at each sampling site, such that differences in potential between said charge collection wells respectively adjacent each of said charge potential wells at each of said charge splitting sampling site are a function of the transient data signal at each respective site, and means for abruptly raising the potential of the charge potential well at each sampling site at a selected sampling time to split substantially all of said charge carriers into said respectively adjacent charge collection wells to provide packets of charge carriers disposed along said charge transfer channel which record said electrical transient data signal.

8. A device in accordance with claim 7 further including means in charge transfer communication with said charge transfer channel means for measuring charge packets and for providing an output signal corresponding to the quantity of charge transferred thereto.

9. A device in accordance with claim 7 wherein said transfer channel means comprises an n-type buried CCD transfer channel, and wherein said transmission line means is a serpentine aluminum conductor.

10. A method for recording transient data signals comprising the steps of providing a plurality of charge potential wells each containing a predetermined quantity of charge carriers, at a plurality of sampling sites disposed along a charge transfer channel, providing a plurality of empty charge collection wells immediately adjacent each charge potential well, propagating a transient data signal to be recorded along a transmission line sequentially to each of said plurality of sampling sites to differentially vary the potential of at least one of said collection wells at each sampling site such that a representation of the transient data signal in time is provided along said sampling sites, and abruptly raising the potential of said charge potential wells to split the charge carriers contained therein into the respective adjacent collection wells to record the transient signal as a function of the distribution of charge carriers between or among the charge collection wells respectively adjacent each charge potential well.

11. A method in accordance with claim 10 further comprising the step of measuring the quantity of charge in at least one of the collection wells adjacent each potential well at each sampling site.

12. A method in accordance with claim 10 wherein there are two collection wells adjacent each charge potential well, wherein said transient signal varies the potential of one collection well and wherein the other collection well is maintained at a reference potential.

* * * * *